United States Patent
Lodi

[11] 4,085,460
[45] Apr. 18, 1978

[54] DECODER BUFFER CIRCUIT FOR MNOS MEMORY

[75] Inventor: Robert J. Lodi, Tewksbury, Mass.

[73] Assignee: Sperry Rand Corporation, New York, N.Y.

[21] Appl. No.: 673,559

[22] Filed: Apr. 5, 1976

[51] Int. Cl.$^2$ .............................................. G11C 7/00
[52] U.S. Cl. .............................. 365/230; 307/DIG. 1; 365/184
[58] Field of Search ............ 340/173 R; 307/DIG. 1, 307/DIG. 5, 270

[56] References Cited

U.S. PATENT DOCUMENTS

| | | | |
|---|---|---|---|
| 3,747,072 | 7/1973 | Lodi et al. | 340/173 R |
| 3,772,607 | 11/1973 | Luckett et al. | 307/DIG. 1 |
| 3,971,001 | 7/1976 | Lodi | 340/173 R |

Primary Examiner—Stuart N. Hecker
Assistant Examiner—Donald McElheny
Attorney, Agent, or Firm—Howard P. Terry; Albert B. Cooper

[57] ABSTRACT

The decoder buffer is utilized in a memory system for an array of variable threshold MNOS transistor memory cells arranged in word rows. The gate electrodes of the memory transistors comprising each word row is coupled via a word line to the output of a decoder buffer. Inputs to the decoder buffers are provided from address decoder and inverter circuits in response to memory address inputs. FET control circuitry is included for selectively providing operating voltages to the decoder buffers in accordance with the various memory functions performed. Each decoder buffer comprises first, second and third fixed threshold field effect transistors, the first and second transistors being serially connected with respect to each other, forming a junction therebetween which is coupled to the associated one of the memory word lines. The third transistor is connected between the gate of the first transistor and the junction between the first and second transistors, the associated address decoder output line being connected to the gate of the first transistor. The control circuits provide operating voltages selectively to the electrodes of the first and second transistors opposite the junction and to the gate electrode of the third transistor for controlling the buffers in the various modes of the memory.

4 Claims, 4 Drawing Figures

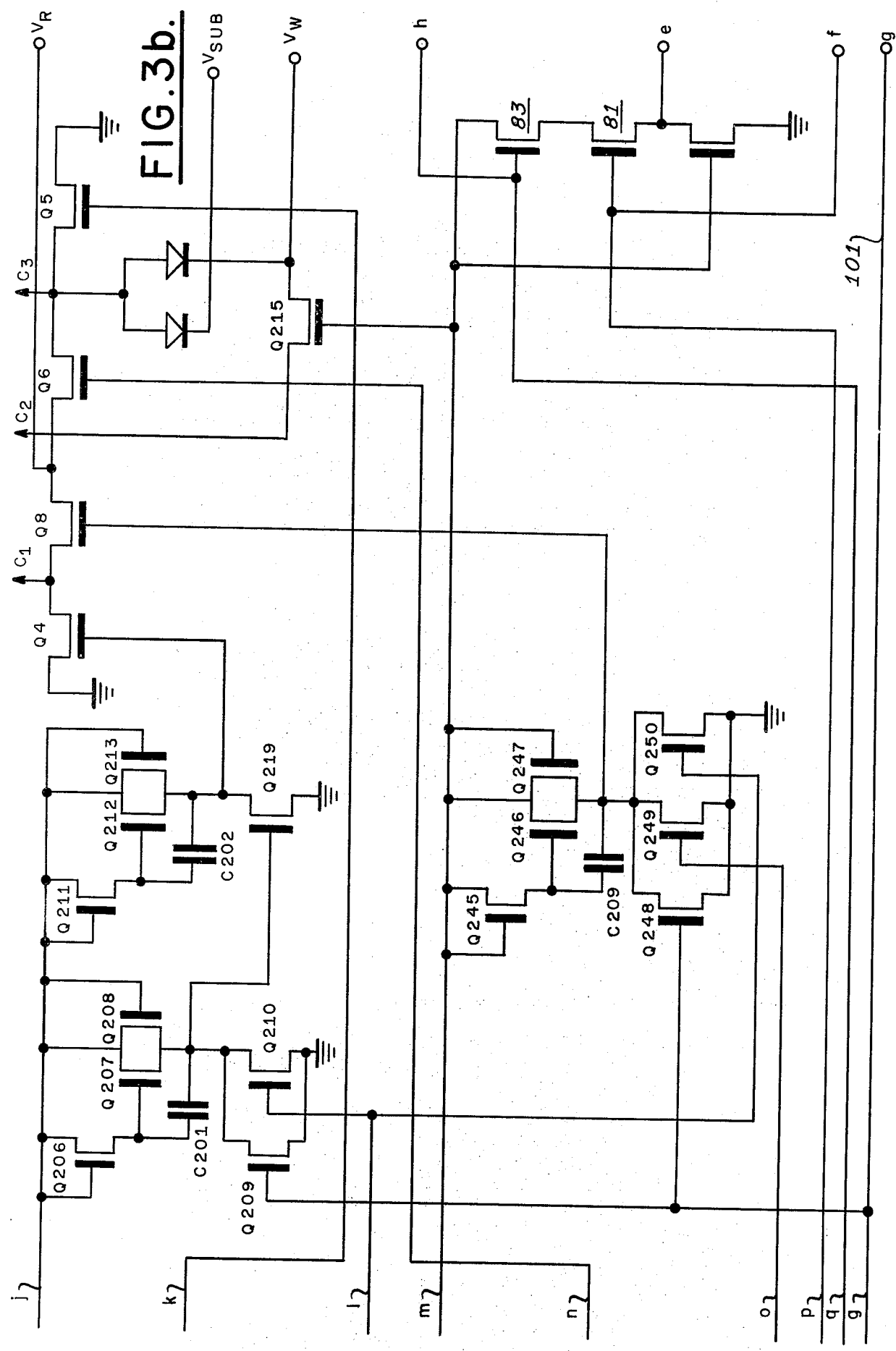

DECODER BUFFER CIRCUIT FOR MNOS MEMORY

The invention herein described was made in the course of or under a contract or subcontract thereunder, of the Navy.

BACKGROUND OF THE INVENTION

1. Field of the Invention

The invention relates to computer memory devices utilizing variable threshold MNOS transistors as memory elements and is particularly concerned with the decoder buffer circuit thereof.

2. Description of the Prior Art

U. S. Pat. No. 3,747,072, issued July 17, 1973 in the names of R. J. Lodi and H. A. R. Wegener, entitled "Integrated Static MNOS Memory Circuit" and issued to the present assignee, discloses a self-contained integrated memory utilizing variable threshold MNOS transistors as the memory elements. This memory arrangement operates in a variety of functional modes such as READ, WRITE and CLEAR in response to input control signals E and R/W with appropriate words of the memory being selected via address signals $A_1$ and $A_2$. Power is provided for the memory by supply potentials $V_G$ and $V_D$.

Although the memory of said U.S. Pat. No. 3,747,072 provides satisfactory performance in the various operating modes, it was recognized that by utilizing a novel decoder buffer circuit improvements could be effected with respect to the required power supply potential, the power dissipation of the circuit and the read accesss time. In the device of said U.S. Pat. No. 3,747,072 the variable threshold transistors of the memory array 11 require application of −25 volts to their gate electrodes which −25 volts is provided on the word lines from the decoder buffers of the circuit. As described in said U.S. Pat. No. 3,747,072, the decoder buffer circuit associated with each word line is comprised of two serially connected transistors such as transistors 67 and 91. The transistor 67 operates in a source follower mode in its saturation region with the transistor 91 providing the load therefor. As described in the patent, −30 volts from the $V_D$ supply is provided on the line 85 and because of an approximate 5 volt drop across the source follower transistor 67, −25 volts is applied to the word line. The source follower transistor, such as 67, for the selected decoder buffer requires at least −30 volts on its gate electrode which potential is provided from the $V_D$ supply through the associated address decoder transistor such as transistor 41. In order for the transistor 41 to provide the −30 volt potential to the gate of the transistor 67, the potential $V_G$ applied to the gate of the transistor 41 must be at least −35 volts. For operational stability $V_G$ is chosen as −40 volts in the patent. Alternatively the $V_G$ and $V_D$ terminals may be tied together which would cause the transistor 41 to operate in its saturation region requiring a power supply potential of −35 volts for $V_D$ in order to provide −30 volts at the gate electrode of transistor 67. Thus it is appreciated that with both arrangements the power supply potential $V_D$ or $V_G$ must be two fixed threshold transistor voltage drops ($V_T$) greater than the potential required at the word lines.

These extraneous voltage drops result in a power supply potential greater than that required to actually drive the memory transistors 15. A reduction of power supply potential from the required −35 volts to, for example, −30 volts would result in greater circuit yield since the higher the potential that is required to be applied to the circuit chip, the greater will be the propensity of the chip toward voltage breakdown.

As described in said U.S. Pat. No. 3,747,072, the decoder buffers operate as source followers in the WRITE mode. The source follower mode of operation requires a buffer decoder load transistor such as the transistor 91 in order that the word lines are discharged after the write operation. Thus in the WRITE mode current will flow through the serially connected transistors such as 67 and 91 when the write potential is applied from the buffer drive circuit resulting in unwanted power dissipation.

As described in said U.S. Pat. No. 3,747,072, the two serially connected decoder buffer transistors associated with each word line are utilized in both the READ mode and the WRITE mode and operate in both modes as a source follower. The read voltage is applied from the buffer drive circuit via the same circuit path used for writing. Since the fixed threshold transistors switch relatively slowly, approximately five times slower in the source follower mode than in the triode mode, the read access time of the memory is adversely affected. Since the same decoder buffer circuitry is utilized for both reading and writing, a compromise in design was necessitated to perform both operations with the same devices.

Additionally, the read and write potentials are applied via the buffer drive circuit by switching the power supply which technique may be less desirable than applying the read and write potentials to separate input pins as d.c. levels.

SUMMARY OF THE INVENTION

The decoder buffer circuit of the present invention provides improvements over that of said U.S. Pat. No. 3,747,072 in that the power supply need provide a potential that is only one fixed threshold drop $V_T$ greater than the potential required on the word line. Additionally, the read access time is significantly reduced by utilizing transistor switching in the triode region rather than in the source follower region. In the present arrangement the read and write potentials are applied to separate input pins as d.c. levels and the transistors controlling the read potential are designed to control only read levels.

These improvements are effected by utilizing a decoder buffer comprising first, second and third transistors with said first and second transistors serially connected with respect to each other with the junction therebetween providing the potential for the word line. The third transistor is coupled between the gate electrode of the first transistor and the junction between the first and second transistors. The gate electrode of the first transistor is coupled to the associated address decoder output line. The terminals of the first and second transistors opposite the junction therebetween, as well as the gate electrode of the third transistor, are coupled to receive operating potentials for controlling the various modes of the memory.

DESCRIPTION OF THE PREFERRED EMBODIMENT

Figure 1:
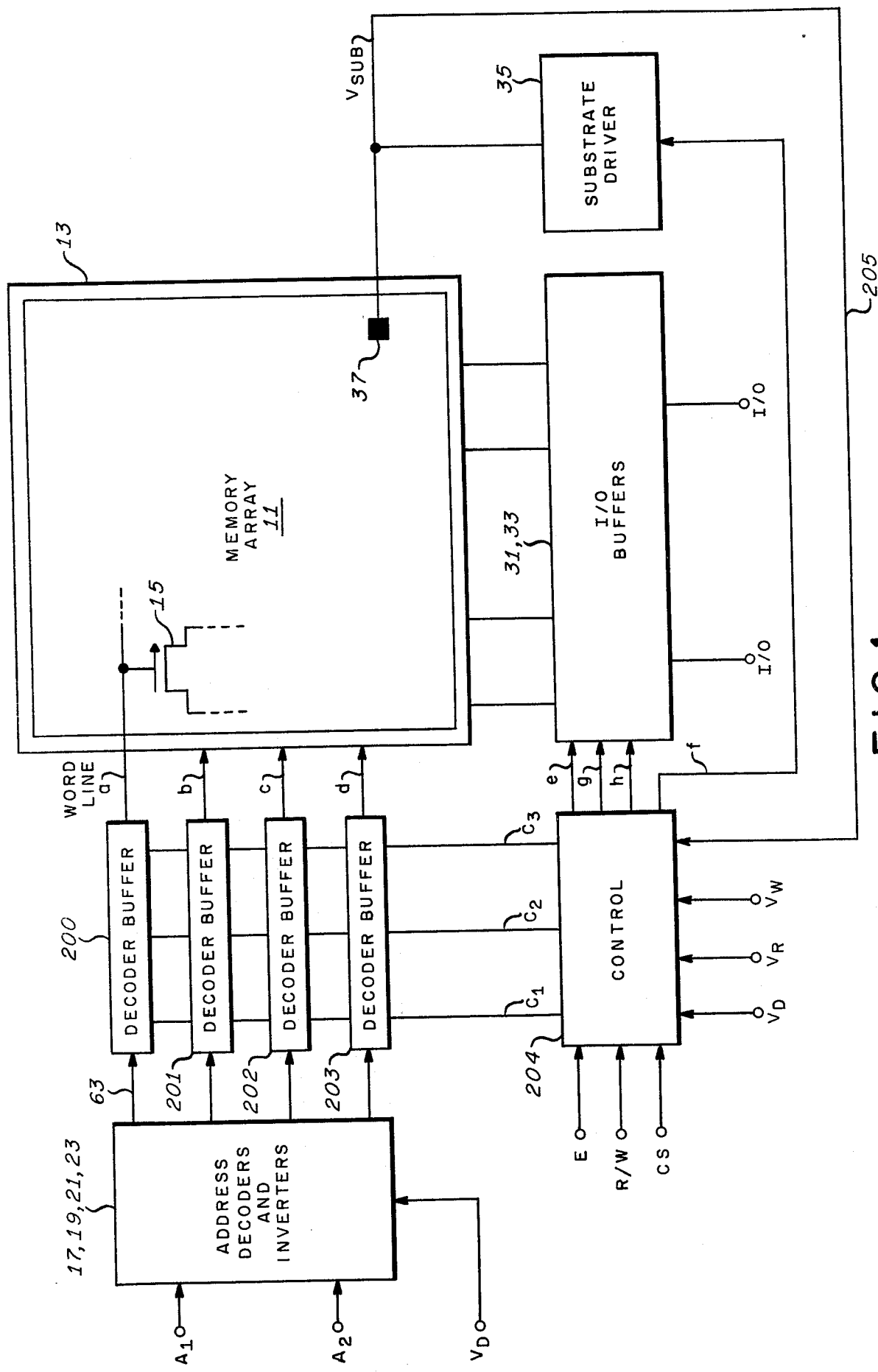
FIG. 1 is a schematic block diagram illustrating the general arrangement of the memory of said U.S. Pat. No. 3,747,072.

Referring to FIG. 1, a general schematic block diagram of the memory apparatus of said U.S. Pat. No. 3,747,072 is illustrated. For convenience, reference numerals below 200 will be utilized to designate specific components described in said U.S. Pat. No. 3,747,072 and having the same reference numerals and reference numerals 200 and greater will be utilized in reference to the present application. Additionally, the power supply $V_G$ will be eliminated and the terminals so marked connected to the $V_D$ supply.

The address decoders and inverters of FIG. 1 comprise the decoders and address inverters 17, 19, 21 and 23 of said U.S. Pat. No. 3,747,072. The outputs from the address decoders 17 and 19 are applied to decoder buffers 200, 201, 202 and 203 respectively, each of the decoder buffers being implemented in accordance with the invention in a manner to be described below. The buffers 200, 201, 202 and 203 are identical with respect to each other. The outputs of the decoder buffers 200, 201, 202 and 203 are applied to memory word lines a, b, c and d respectively which provide the gate potentials to the memory array 11 as described in said U.S. Pat. No. 3,747,072. One of the memory transistors 15 is depicted for illustrative purposes. FIG. 1 also illustrates I/O buffers 31 and 33 as well as substrate driver 35 instrumented and connected with the memory array 11 identically as described in said U.S. Pat. No. 3,747,072.

The control circuit 29 of said U.S. Pat. No. 3,747,072 is replaced by a control circuit 204 which is responsive to control signals E, R/W and CS as well as operating potentials $V_R$ and $V_W$. The control circuit 204 is also responsive to an operating potential $V_{SUB}$ from the substrate driver 35 which is applied via a lead 205. The control circuit 204 also receives power from the $V_D$ supply which is typically $-30$ volts as described in said U.S. Pat. No. 3,747,072. The control circuit 204 provides inputs e, g and h to the I/O buffers 31 and 33 and input f to the substrate driver 35 in identically the same manner as described in said U.S. Pat. No. 3,747,072. The control circuit 204 also applies control signals $C_1$, $C_2$ and $C_3$ to each of the decoder buffers 200, 201, 202 and 203 in a manner to be described.

Figure 2:
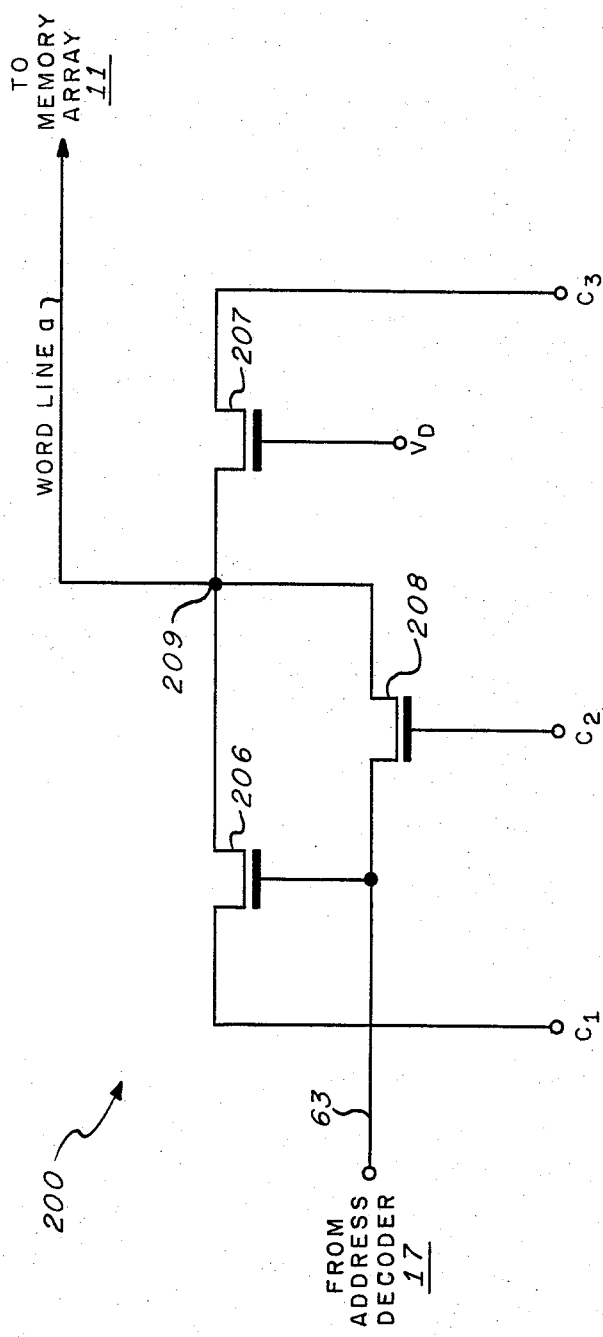
FIG. 2 is a schematic wiring diagram illustrating the decoder buffer implemented in accordance with the invention.

Referring now to FIG. 2, the decoder buffer 200 implemented in accordance with the invention is illustrated. The decoder buffer 200 comprises first, second and third fixed threshold field effect transistors 206, 207 and 208. The transistors 206 and 207 are serially connected with respect to each other with the drain of the transistor 206 being connected to the source of the transistor 207. The junction 209 therebetween provides the buffer output to a word line of the memory array 11. The transistor 208 is connected between the junction 209 and the gate of the transistor 206. The output 63 from the address decoder 17 is applied to the gate electrode of the transistor 206 and the source electrode of the transistor 208. Control potentials $C_1$, $C_2$ and $C_3$ are applied respectively to the source of the transistor 206, the gate electrode of transistor 208 and the drain electrode of the transistor 207. The gate of the transistor 207 is connected to the power supply $V_D$. The decoder buffers 201, 202 and 203 (FIG. 1) are configured and connected identically as described with respect to the decoder buffer 200 except with respect to the input and output connections to the appropriate address decoder lines and memory word lines respectively.

As described in detail in said U.S. Pat. No. 3,747,072, the memory is configured to operate in the following modes: READ, CLEAR and WRITE. Additionally, the arrangement of the present invention is provided with a NON-SELECT as well as a BI-POLAR READ mode.

The decoder buffers 200, 201, 202 and 203 are controlled in the various operating modes by applying operating potentials to the $C_1$, $C_2$ and $C_3$ terminals in accordance with the following table.

| Mode | Input From Address Decoder | Decoder Buffer Output | C1 | C2 | C3 |
|---|---|---|---|---|---|
| Read | $V_D - V_T$ (Selected) | $V_R$ | $V_R$ | O | O |
|  | O (Not-Selected) | O |  |  |  |
| Bipolar | $V_D - V_T$ (Selected) | O | O | O | $V_R$ |
|  | O (Not-Selected) | $V_R$ |  |  |  |
| Clear | $V_D - V_T$ (Selected) | O | O | O | $V_{SUB}$ |
|  | O (Not-Selected) | $V_{SUB} - V_T$ |  |  |  |
| Write | $V_D - V_T$ (Selected) | $V_W - V_T$ | OPEN | $V_D - V_T$ | $V_W$ |
|  | O (Not-Selected) | O |  |  |  |
| Non-Select | $V_D - V_T$ (Selected) | O | O | O | O |
|  | O (Not-Selected) | O |  |  |  |

The write voltage $V_W$ is selected at the $V_D$ level or $-30$ volts. The read voltage $V_R$ is approximately $-15$ volts. The $V_{SUB}$ voltage is derived from the substrate driver 35 on the lead 205 as explained above. The $V_T$ voltage is equal to one threshold voltage drop across a fixed threshold transistor of the circuit when the transistor is operated in its saturation region, i.e., in a source follower mode and is approximately 5 volts. The detailed operation of the buffer 200 will now be described with respect to the five operating modes.

READ MODE

In the READ MODE the $V_R$ potential is applied to the terminal $C_1$ and the terminals $C_2$ and $C_3$ are grounded, The buffer associated with the selected word receives a signal $V_D - V_T$ from the associated address decoder circuit and provides $V_R$ on the selected word line. A non-selected decoder buffer receives ground potential from the associated address decoder and provides ground potential on the associated word line. In the READ mode the transistor 208 is maintained off by applying ground potential to $C_2$. The transistors 206 and 207 are designed such that a $V_D$ - $V_T$ level from the address decoder causes transistor 206 to turn on, transmitting the $V_R$ level at $C_1$ to the output word line. The transistor 207 is a high resistance device which limits the current flow and reduces the voltage drop across the transistor 206 to a negligible level. The signals from the address decoder for the non-selected words are at ground potential maintaining the transistor 206 of the non-selected decoder buffers in a nonconducting state causing the associated output word lines to be at ground potential as transmitted by the transistor 207. During the READ mode the memory transistor substrate is maintained at ground potential so that the selected memory transistors have $V_R$ applied between their gates and substrates and the non-selected transistors have zero potential applied between their gates and substrates. It will be appreciated that the transistor 206 of the selected decoder buffer is switched on and off in its triode region thereby effecting fast switching with a consequent rapid read access time.

BI-POLAR READ MODE

The BI-POLAR READ function is implemented by reversing the levels applied to the $C_1$ and $C_3$ control inputs with respect to the READ mode while maintaining the $C_2$ input at ground potential. Transistor 206 is turned on by the output from the selected address decoder driving the selected decoder buffer output word line to ground potential while the non-selected word lines are maintained at the read level $V_R$ via the conducting transistor 207. In the BI-POLAR READ mode the memory substrate is maintained at $V_R$ and the selected memory transistors have a $-V_R$ applied to their gates with respect to their substrates. In the BI-POLAR READ mode the substrate driver 35 is disconnected from the substrate terminal 37 of said U.S. Pat. No. 3,747,072 and the $V_R$ potential applied directly thereto.

CLEAR MODE

The CLEAR portion of the WRITE cycle requires that the output word line of the selected decoder buffer be at ground potential. This is achieved by maintaining $C_1$ and $C_2$ at ground potential. The $V_D$ - $V_T$ level from the selected address decoder turns the transistor 206 on providing ground potential at the buffer output, the transistors 206 of the non-selected buffers remaining off. $V_{SUB}$ is applied to the $C_3$ control input and the buffer outputs of the unselected lines are at a $V_{SUB}$ - $V_T$ level. With the memory substrate maintained at $V_{SUB}$ in the CLEAR mode, the selected memory transistors have a $-V_{SUB} + V_T$ applied to the gates thereof with respect to their substrates.

WRITE MODE

During the WRITE portion of the cycle the writing voltage $V_W$ must be applied to the selected word line with the non-selected lines held at ground potential. The $C_1$ control lines is maintained open and $V_D$ - $V_T$ is applied to the $C_2$ terminal while the $V_W$ level is applied to $C_3$. The $V_D$ - $V_T$ level provided by the selected address decoder maintains the transistor 208 in a non-conducting state permitting the selected output word line to rise toward the $V_W$ level. A threshold drop in the transistor 207 results in a final output level of $V_W$-$V_T$. The ground potential level provided from the non-selected address decoders causes current to flow in the transistor 208 and the non-selected word line outputs to be pulled up to ground potential. With the memory substrate at ground potential the selected memory transistors have $V_W$ -$V_T$ applied to their gate electrodes with respect to their substrates. Thus it is appreciated that compared to the decoder buffer of said U.S. Pat. No. 3,747,072 the decoder buffer of the present invention loses only one $V_T$ between the supply potential and the word line. Additionally, the word lines are discharged through the transistor 207 thereby obviating the requirement for the additional current flowing through the source follower arrangement of the decoder buffer of said U.S. Pat. No. 3,747,072 as described above.

NON-SELECT MODE

In the NON-SELECT mode $C_1$, $C_2$ and $C_3$ are all maintained at ground potential resulting in all outputs from the decoder buffers to be at ground potential irrespective of the states of the address decoders.

The control circuit 204 of FIG. 1 controls the decoder buffers 200, 201, 202 and 203 by applying the $C_1$, $C_2$ and $C_3$ signals thereto in response to the control inputs E, R/W and CS and the operating potentials $V_R$, $V_W$ and $V_{SUB}$, the control circuit 204 providing the control signals $C_1$, $C_2$ and $C_3$ as described above to effect the operating modes of the memory. The control circuit 204 also provides signals on the lines $e$, $g$ and $h$ to the I/O buffers 31 and 33 as well as a signal on the line $f$ to the substrate driver 35, for the reasons discussed in detail in said U.S. Pat. No. 3,747,072. The various operating modes of the memory resulting in the control signals as described above are effected in response to the control inputs as follows:

| | CONTROL LINE STATES | | |
|---|---|---|---|
| | E | R/W | CS |
| CLEAR | $-V$ | $-V$ | O |
| WRITE | O | $-V$ | O |
| BI-POLAR READ | $-V$ | O | O |
| READ | O | O | O |
| NON-SELECT | Don't Care | Don't Care | $-V$ | where $-V$ is typically $-15$ volts. Circuits for the block 204 for providing the potentials in response to the inputs are readily designed and implemented by those normally skilled in the art. The details of a suitable circuit for this purpose is illustrated in FIG. 3.

Figure 3A:
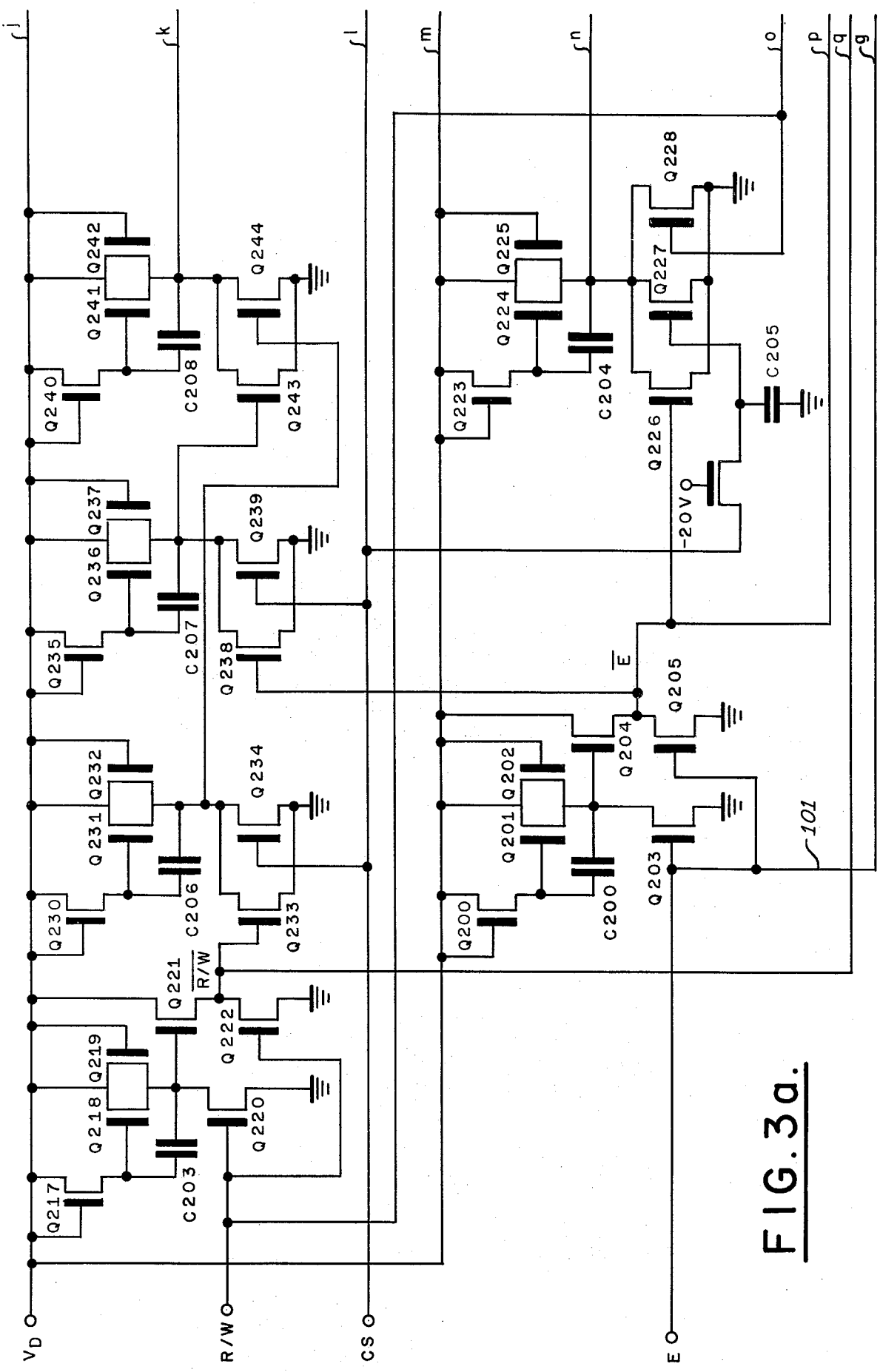
FIG. 3, consisting of 3A and 3B, is a schematic wiring diagram illustrating circuitry for providing the control potentials required by the decoder buffer of the present invention.

Referring now to FIG. 3, the control potentials E, R/W and CS selectively apply the potential $-V$ to the terminals illustrated, in accordance with the above control line state table. A control potential of $-V$ applied to the gate of any of the transistors illustrated turns the transistor on and ground potential applied to the gate thereof turns the transistor off. By the arrangement illustrated, the control potentials $C_1$, $C_2$ and $C_3$ are provided as indicated by the legends in response to the control line states as tabulated above. The potentials provided on the lines $e$, $f$, $g$ and $h$ operate the I/O buffers 31 and 33 and the substrate driver 35 as described in said U.S. Pat. No. 3,747,072. The three serially connected transistors, the upper transistors of which are designated as 81 and 83 are identical to the three similarly connected and designated transistors in said patent. When the $-V$ control potential is applied to the CS input of the control circuit 204, all of the outputs thereof are driven to zero, thus providing an array inhibit function. The $V_R$, $V_W$ and $V_{SUB}$ buffer operating potentials are applied to the input terminals of the control circuit 204 as indicated by the legends. It is appreciated that the write potential $V_W$ applied as shown experiences only one threshold drop $V_T$ in the transistor 207 (FIG. 2), as described above, in applying the write potential to the word line.

From the foregoing it is appreciated that in the WRITE mode only one $V_T$ is lost compared to the two $V_T$ lost in the arrangement of said U.S. Pat. No. 3,747,072. Additionally, less power dissipation is experienced because of the decoder buffer design described above as compared to that of said U.S. Pat. No. 3,747,072 in that extraneous source follower current need not flow with the present arrangement. The read access time utilizing the present decoder buffer should be faster than that of the prior arrangement since in the decoder buffer 200 the transistor 206 switches in its triode region whereas in the decoder buffer of said U.S. Pat. No. 3,747,072 the transistor 65 switches in its source follower mode which is approximately five times slower than in the triode region. Thus the present invention provides for an increase in available buffer output voltage for a given supply voltage and permits the chip to be operated at a smaller supply voltage with equivalent memory performance. The performance is enhanced since any potential provided by the power supplies that is greater than that necessary at the gates of the memory transistors results in increased power dissipation and the need for higher junction breakdown voltages. The buffer circuit of the present invention requires that the applied voltage be only one $V_T$ greater than the desired memory transistor gate voltage. Additionally, the $V_R$ potential is applied to a separate input pin as a d.c. level. This again improves the read access time since the transistors controlling the read potential are designed to control only read levels. In the prior art arrangement the read voltage was applied via the same circuit part used for writing. The prior art technique necessitated compromise in design to perform both operations with the same devices.

Although the above-described embodiment of the invention was explained in terms of p-channel enhancement transistors, it will be appreciated that other polarity devices may be utilized with appropriate polarity potentials to the same effect. It will furthermore be appreciated that although the buffer of FIG. 2 was described in terms of source and drain connections, these terms are interchangeable with respect to the polarities of the potentials applied.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. In a digital memory having an array of variable threshold transistor memory cells formed on a substrate, each said cell having gate electrode means, said cells being arranged in a plurality of word rows with the gate electrode means of each of said rows being coupled to one of a plurality of word lines respectively; address decoder means responsive to address signals and having a plurality of outputs for selectively energizing said outputs in accordance with said address signals; control circuitry responsive to memory control inputs for selectively providing buffer operating voltages in accordance with said memory control inputs and a plurality of decoder buffers responsive to said buffer operating voltages and coupling said plurality of address decoder outputs to said plurality of word lines respectively; each said decoder buffer comprising:

first and second transistors each having source, drain and gate electrodes, said transistors being serially connected with respect to each other forming a junction therebetween, said junction being coupled to the associated one of said word lines, and a third transistor having source, drain and gate electrodes and coupled between said junction and said gate electrode of said first transistor, said gate electrode of said first transistor being coupled to the associated one of said address decoder outputs, said electrodes of said first and second transistors opposite said junction and said gate electrode of said third transistor being coupled to receive said buffer operating voltages for controlling said buffers in the various modes of said memory.

2. The memory of claim 1 in which said drain electrode of said first transistor is connected to said source electrode of said second transistor thereby forming said junction.

3. The memory of claim 2 in which said control circuitry further includes terminal means for receiving a read potential and means for applying said read potential to said source electrode of said first transistor in a read mode of said memory.

4. The memory of claim 2 in which said control circuitry further includes terminal means for receiving a write potential and means for applying said write potential to said drain electrode of said second transistor in a write mode of said memory.

* * * * *